US 9,704,836 B2

(12) United States Patent
Lin et al.

(10) Patent No.: US 9,704,836 B2
(45) Date of Patent: Jul. 11, 2017

(54) SEMICONDUCTOR PACKAGE ASSEMBLY

(71) Applicant: MediaTek Inc., Hsin-Chu (TW)

(72) Inventors: Tzu-Hung Lin, Zhubei (TW); I-Hsuan Peng, Hsinchu (TW); Ching-Wen Hsiao, Hsinchu (TW)

(73) Assignee: MEDIATEK INC., Hsin-chu (TW)

( * ) Notice: Subject to any disclaimer, the term of this patent is extended or adjusted under 35 U.S.C. 154(b) by 0 days.

(21) Appl. No.: 15/014,636

(22) Filed: Feb. 3, 2016

(65) Prior Publication Data
US 2016/0276324 A1    Sep. 22, 2016

Related U.S. Application Data

(60) Provisional application No. 62/133,680, filed on Mar. 16, 2015.

(51) Int. Cl.
*H01L 23/485* (2006.01)
*H01L 25/10* (2006.01)
(Continued)

(52) U.S. Cl.
CPC .......... *H01L 25/16* (2013.01); *H01L 23/3107* (2013.01); *H01L 23/49811* (2013.01); *H01L 23/49816* (2013.01); *H01L 23/49822* (2013.01); *H01L 23/49827* (2013.01); *H01L 23/5389* (2013.01); *H01L 24/14* (2013.01);
(Continued)

(58) Field of Classification Search
CPC ... H01L 25/16; H01L 25/105; H01L 25/0655; H01L 25/0657; H01L 24/14; H01L 24/19; H01L 23/3107; H01L 23/481; H01L 23/49811; H01L 23/49816; H01L 23/49822; H01L 23/49827; H01L 23/5389; H01L 23/3157
USPC ........ 257/531, 532, 686, 690, 774, E23.141, 257/E23.172, E25.012, E25.029, E27.114, 257/E21.502, E21.705; 361/762, 763; 438/107, 124
See application file for complete search history.

(56) References Cited

U.S. PATENT DOCUMENTS 7,964,961 B2 * 6/2011 Lee ...................... H01L 23/3128
257/737
8,624,353 B2 * 1/2014 Lin ........................ H01L 24/97
257/531
(Continued)

FOREIGN PATENT DOCUMENTS

TW    201242467 A1    10/2012
TW    201431039 A      8/2014
TW    201436067 A      9/2014

*Primary Examiner* — Dao H Nguyen
(74) *Attorney, Agent, or Firm* — McClure, Qualey & Rodack, LLP

(57) ABSTRACT

The invention provides a semiconductor package assembly. The semiconductor package assembly includes a first semiconductor package including a first semiconductor die. A first redistribution layer (RDL) structure is coupled to the first semiconductor die. The first redistribution layer (RDL) structure includes a first conductive trace disposed at a first layer-level. A second conductive trace is disposed at a second layer-level. A first inter-metal dielectric (IMD) layer and a second inter-metal dielectric (IMD) layer, which is beside the first inter-metal dielectric (IMD) layer, are disposed between the first conductive trace and the second conductive trace.

41 Claims, 6 Drawing Sheets

(51) Int. Cl.
  *H01L 21/02*    (2006.01)
  *H01L 25/16*    (2006.01)
  *H01L 23/31*    (2006.01)
  *H01L 23/00*    (2006.01)
  *H01L 25/065*   (2006.01)
  *H01L 23/538*   (2006.01)
  *H01L 23/498*   (2006.01)

(52) U.S. Cl.
  CPC .............. *H01L 24/19* (2013.01); *H01L 24/20* (2013.01); *H01L 25/0655* (2013.01); *H01L 25/0657* (2013.01); *H01L 25/105* (2013.01); *H01L 2224/04042* (2013.01); *H01L 2224/04105* (2013.01); *H01L 2224/12105* (2013.01); *H01L 2224/13024* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/14* (2013.01); *H01L 2924/1436* (2013.01); *H01L 2924/15311* (2013.01); *H01L 2924/19041* (2013.01); *H01L 2924/19104* (2013.01)

(56) References Cited

U.S. PATENT DOCUMENTS

| | | |
|---|---|---|
| 9,368,563 B2 | 6/2016 | Lin et al. |
| 2003/0227095 A1 | 12/2003 | Fujisawa et al. |
| 2007/0242440 A1* | 10/2007 | Sugaya ............... H01L 23/3128 361/762 |
| 2008/0182366 A1* | 7/2008 | Ogawa .................... G02B 6/43 438/124 |
| 2009/0179319 A1* | 7/2009 | Lee ......................... H01L 23/13 257/686 |
| 2009/0236686 A1 | 9/2009 | Shim et al. |
| 2010/0224960 A1 | 9/2010 | Fischer |
| 2011/0062549 A1* | 3/2011 | Lin ..................... H01L 23/3128 257/531 |
| 2012/0018882 A1 | 1/2012 | Shim et al. |
| 2013/0307119 A1 | 11/2013 | Chen et al. |
| 2016/0181231 A1* | 6/2016 | Lin ......................... H01L 24/97 257/686 |
| 2016/0307778 A1 | 10/2016 | Lin et al. |
| 2017/0025397 A1 | 1/2017 | Hung et al. |

* cited by examiner

SEMICONDUCTOR PACKAGE ASSEMBLY

CROSS REFERENCE TO RELATED APPLICATIONS

This application claims the benefit of U.S. Provisional Application No. 62/133,680 filed Mar. 16, 2015, the entirety of which is incorporated by reference herein.

BACKGROUND OF THE INVENTION

Field of the Invention

The present invention relates to a semiconductor package assembly, and in particular to a semiconductor package assembly with a passive device.

Description of the Related Art

In order to ensure miniaturization and multi-functionality of electronic products and communication devices, it is desired that semiconductor packages be small in size, support multi-pin connection, operate at high speeds, and have high functionality. A conventional semiconductor package usually places passive devices on a printed circuit board (PCB). However, the PCB is required to provide additional area for the passive devices mounted thereon. It is hard to reduce the package size.

Thus, a novel semiconductor package assembly is desirable.

BRIEF SUMMARY OF THE INVENTION

A semiconductor package assembly is provided. An exemplary embodiment of a semiconductor package assembly includes a first semiconductor package. The first semiconductor package includes a first semiconductor die. A first redistribution layer (RDL) structure is coupled to the first semiconductor die. The first redistribution layer (RDL) structure includes a first conductive trace disposed at a first layer-level. A second conductive trace is disposed at a second layer-level. A first inter-metal dielectric (IMD) layer and a second inter-metal dielectric (IMD) layer, which is beside the first inter-metal dielectric (IMD) layer, are disposed between the first conductive trace and the second conductive trace.

Another exemplary embodiment of a semiconductor package assembly includes a first semiconductor package including a first semiconductor die. A first redistribution layer (RDL) structure is coupled to the first semiconductor die. The first redistribution layer (RDL) structure includes a first conductive trace disposed at a first layer-level. A second conductive trace is disposed at a second layer-level. A first inter-metal dielectric (IMD) layer and a second inter-metal dielectric (IMD) layer are disposed between the first conductive trace and the second conductive trace. A capacitor structure is composed of the first conductive trace, the second conductive trace and the second inter-metal dielectric (IMD) layer. The dielectric constant of the first inter-metal dielectric (IMD) layer is five times lower than the dielectric constant of the second inter-metal dielectric (IMD) layer.

Yet another exemplary embodiment of a semiconductor package assembly includes a first semiconductor package. The first semiconductor package includes a first semiconductor die. A first redistribution layer (RDL) structure is coupled to the first semiconductor die. The redistribution layer (RDL) structure includes a first conductive trace at a first layer-level. A second conductive trace is disposed at a second layer-level. A first inter-metal dielectric (IMD) layer and a second inter-metal dielectric (IMD) layer are disposed between the first conductive trace and the second conductive trace. A capacitor structure is composed of the first conductive trace, the second conductive trace and the second inter-metal dielectric (IMD) layer. The thickness of the second inter-metal dielectric (IMD) layer is less than or equal to those of the first conductive trace and the second conductive trace.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
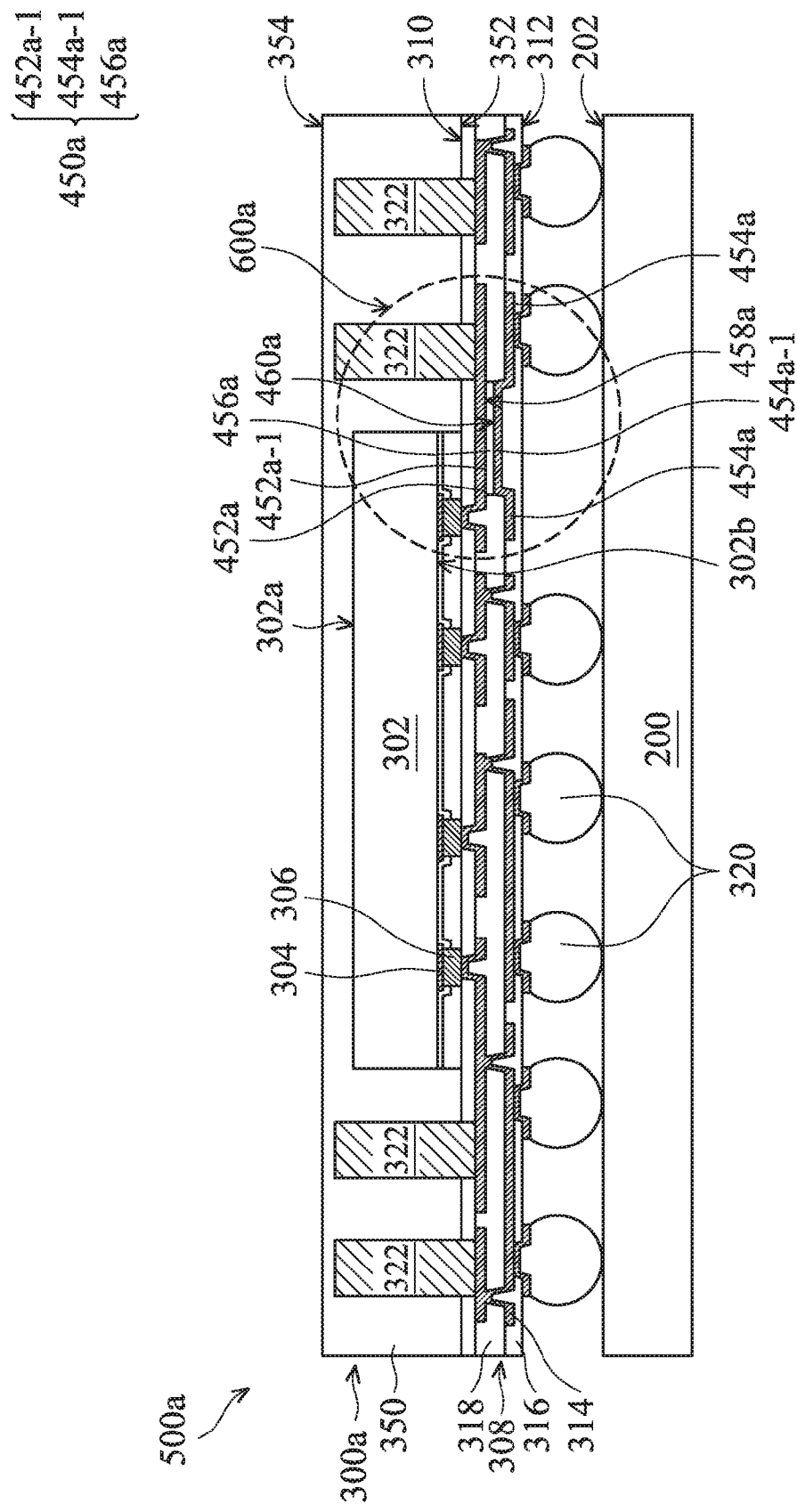
FIG. 1A is a cross-sectional view of a semiconductor package assembly including a system-on-chip (SOC) package in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1B:
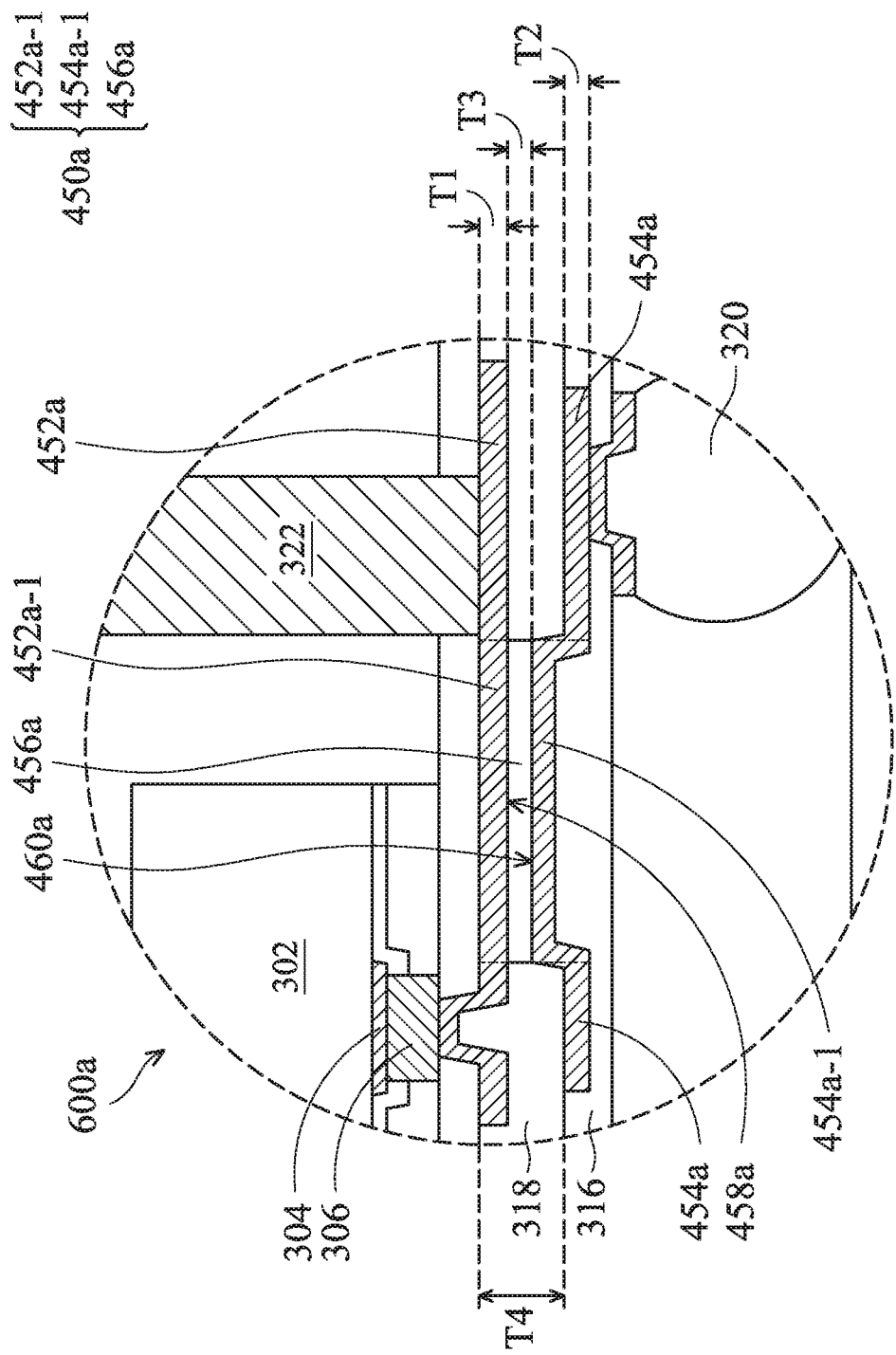
FIG. 1B is an enlarged view of a portion of FIG. 1A, showing a metal-insulator-metal (MIM) capacitor structure embedded in a redistribution layer (RDL) structure.

FIG. 1A is a cross-sectional view of a semiconductor package assembly 500a including a system-on-chip (SOC) package in accordance with some embodiments of the disclosure. FIG. 1B is an enlarged view of a portion 600a of FIG. 1A, showing a metal-insulator-metal (MIM) capacitor structure 450a embedded in a redistribution layer (RDL) structure 308. In some embodiments, the semiconductor package assembly 500a is a wafer-level semiconductor package assembly, for example, a flip-chip semiconductor package assembly.

As shown in FIG. 1A, the semiconductor package assembly 500a includes at least one wafer-level semiconductor package mounted on a base 200. In this embodiment, the wafer-level semiconductor package 300a includes a system-on-chip (SOC) package.

As shown in FIG. 1A, the base 200, for example a printed circuit board (PCB), may be formed of polypropylene (PP). It should also be noted that the base 200 can be a single layer or a multilayer structure. A plurality of pads (not shown) and/or conductive traces (not shown) is disposed on a die-attach surface 202 of the base 200. In one embodiment, the conductive traces may comprise power segments, signal trace segments or ground trace segments, which are used for the input/output (I/O) connections of the semiconductor package 300a. Also, the semiconductor package 300a is mounted directly on the conductive traces. In some other embodiments, the pads are disposed on the die-attach surface 202, connected to different terminals of the conductive traces. The pads are used for the semiconductor package 300a mounted directly thereon.

As shown in FIG. 1A, the semiconductor package 300a is mounted on the die-attach surface 202 of the base 200 by a bonding process. The semiconductor package 300a is mounted on the base 200 through the conductive structures 320. The semiconductor package 300a includes a semiconductor die 302 and a redistribution layer (RDL) structure 308. In one embodiment, the semiconductor die 302 may be a system-on-chip (SOC) die. In another embodiment, the semiconductor die 302, for example, may include a logic die including a central processing unit (CPU), a graphics processing unit (GPU), a dynamic random access memory (DRAM) controller or any combination thereof.

As shown in FIG. 1A, the semiconductor die 302 is fabricated by flip-chip technology. Pads 304 of the semiconductor die 302 are disposed on a front surface 302b to be electrically connected to the circuitry (not shown) of the semiconductor die 302. In some embodiments, the pads 304 belong to the uppermost metal layer of the interconnection structure (not shown) of the semiconductor die 302. The pads 304 of the semiconductor die 302 are in contact with the corresponding conductive structures 306, for example, conductive bumps. It should be noted that the number of semiconductor dies 302 integrated in the semiconductor package assembly 500a is not limited to that disclosed in the embodiment.

As shown in FIG. 1A, the semiconductor package 300a further includes a molding compound 350 covering and surrounding the semiconductor die 302. The molding compound 350 is in contact with the semiconductor die 302. The molding compound 350 has opposite surfaces 352 and 354 that are respectively close to the front surface 302b and back surface 302a of the semiconductor die 302. The molding compound 350 may also cover the back surface 302a of the semiconductor die 302. In some embodiments, the molding compound 350 may be formed of a nonconductive material, such as an epoxy, a resin, a moldable polymer, or the like. The molding compound 350 may be applied while substantially liquid, and then may be cured through a chemical reaction, such as in an epoxy or resin. In some other embodiments, the molding compound 350 may be an ultra-violet (UV) or thermally cured polymer applied as a gel or malleable solid capable of being disposed around the semiconductor die 302, and then may be cured through a UV or thermal curing process. The molding compound 350 may be cured with a mold (not shown).

As shown in FIG. 1A, the semiconductor package 300a further includes the redistribution layer (RDL) structure 308 disposed over the front surface 302b of the semiconductor die 302. The RDL structure 308 is also disposed on the surface 352 of the molding compound 350. The semiconductor die 302 of the semiconductor package 300a is connected to a surface 310 of the RDL structure 308 through conductive structures 306, for example, conductive bumps or solder pastes. The RDL structure 308 may be in contact with the molding compound 350. In some embodiments, the RDL structure 308 may have one or more conductive traces 314 (comprising a first conductive trace 452a and a second conductive trace 454a) disposed in one or more inter-metal dielectric (IMD) layers 318. Pad portions of the conductive traces 314 are exposed to openings of the solder mask layer 316. However, it should be noted that the number of conductive traces 314 and the number of IMD layers 318 shown in FIG. 1A is only an example and is not a limitation to the present invention.

As shown in FIGS. 1A and 1B, the RDL structure 308 of the semiconductor package 300a further includes a metal-insulator-metal (MIM) capacitor structure 450a embedded therein. The MIM capacitor structure 450a is coupled to the semiconductor die 302. In some embodiments, the MIM capacitor structure 450a includes a first electrode 452a-1, a second electrode 454a-1 and an inter-metal dielectric (IMD) layer 456a therebetween. In some embodiments, the first electrode 452a-1 is a segment of a first conductive trace 452a of the RDL structure 308, which is close to the SOC die 302. Also, the second electrode 454a-1 is a segment of a second conductive trace 454a of the RDL structure 308, which is close to the conductive structures 320. As shown in FIGS. 1A and 1B, the first conductive trace 452a is designed to be positioned at a first layer-level, and the second conductive trace 454a is designed to be positioned at a second layer-level different from the first layer-level. Also. The first conductive trace 452a is separated from the second conductive trace 454a through the inter-metal dielectric (IMD) layers 318 and 456a.

In one embodiment as shown in FIG. 1B, the first electrode 452a-1 is substantially parallel to the second electrode 454a-1. The first electrode 452a-1 and the second electrode 454a-1 of the MIM capacitor structure 450a are strip shape in a cross-sectional view. For example, each of the first electrode 452a-1 and the second electrode 454a-1 has an even surface in the cross-sectional view as shown in FIGS. 1A and 1B. The first conductive trace 452a and the first electrode 452a-1 are designed to have a uniform thickness T1. Similarly, the second conductive trace 454a and the second electrode 454a-1 are designed to have a uniform thickness T2. In some embodiments, the thickness T1 is substantially equal to the thickness T2. For example, the thickness T1 and the thickness T2 are designed to be lower than or equal to 4 μm.

As shown in FIGS. 1A and 1B, the IMD layer 456a of the MIM capacitor structure 450a is disposed beside the IMD layer 318, which is between the first conductive trace 452a and the second conductive trace 454a. The IMD layer 456a is strip shape in a cross-sectional view. Also, an interface 458a between the first electrode 452a-1 and the IMD layer 456a, or an interface 460a between the second electrode 454a-1 and the IMD layer 456a, is substantially an even surface in the cross-sectional view as shown in FIGS. 1A and 1B. In some embodiments, the IMD layer 456a is a high-k dielectric layer (k is the dielectric constant of the dielectric layer). The k-value of the IMD layer 456a is designed to be larger than or equal to 20, which is much greater than that of the IMD layer 318 (the IMD layer 318, for example, a SiO$_2$ layer (k=3.9)). For example, the dielectric constant of the IMD layer 318 is five times lower than the dielectric constant of the IMD layer 456a. In some embodiments, the IMD layer 456a may be formed of organic materials, which include a polymer base material, non-organic materials, which include silicon nitride (SiN$_x$), silicon oxide (SiO$_x$), grapheme, or the like. In some other embodiments, the IMD layer 456a may be formed of a photo sensitive material, which includes a dry film photoresist, or a taping film.

As shown in FIG. 1B, the thickness T3 of the IMD layer 456a of the MIM capacitor structure 450a is designed to be less than the thickness T4 of the IMD layer 318. Also, the thickness T3 of the IMD layer 456a is designed to be less than or equal to the thickness T1 of the first conductive trace 452a and the thickness T2 of the second conductive trace 454a in the cross-sectional view as shown in FIG. 1B. For example, the thickness T3 of the IMD layer 456a of the MIM capacitor structure 450a is designed to be less than or equal to about 4 μm.

As shown in FIG. 1A, the semiconductor package 300a further includes vias 322 passing through the molding compound 350. The vias 322 are coupled to the conductive traces 314 (comprising a first conductive trace 452a and a second conductive trace 454a) of the RDL structure 308. The semiconductor die 302 is surrounded by the vias 322. Two terminals of each of the vias 322 are respectively close to the surface 310 of the RDL structure 308 and the surface 354 of the molding compound 350. In some embodiments, the vias 322 may comprise through package vias (TPVs) formed of copper.

As shown in FIG. 1A, the semiconductor package 300a further includes conductive structures 320 disposed on a surface 312 of the RDL structure 308, which is away from the semiconductor die 302. The conductive structures 320 are coupled to the conductive traces 314 through the exposed to openings of the solder mask layer 316. Also, the conductive structures 320 are separated from the molding compound 350 through the RDL structure 308. In other words, the conductive structures 320 are free from contact with the molding compound 350. In some embodiments, the conductive structures 320 may comprise a conductive bump structure such as a copper bump or a solder bump structure, a conductive pillar structure, a conductive wire structure, or a conductive paste structure.

In some embodiments, the semiconductor package assembly 500a is designed to fabricate a passive device structure, for example, a metal-insulator-metal (MIM) capacitor structure 450a embedded in a redistribution layer (RDL) structure 308. The MIM capacitor structure 450a is composed segments of conductive traces (the first electrode 452a-1 and the second electrode 454a-1) of the RDL structure 308 and a high-k capacitor dielectric material layer (the IMD layer 456a) beside the IMD layer (the IMD layer 318) of the RDL structure 308. The capacitor structure 450a is designed to increase the dielectric constant (k) of the IMD layer 456a, or to decrease the thicknesses of the first electrode 452a-1 (the thickness T1), the second electrode 454a-1 (the thickness T2) and the IMD layer 456a (the thickness T3), so that the larger capacitance value is obtained. The embedded MIM capacitor structure 450a can be integrated with the RDL structure 308 and using a process similar to the fabrication process of the RDL structure 308. The MIM capacitor structure 450a may provide comparable process capability in the semiconductor package assembly. Also, the semiconductor package assembly 500a may help to improve the surface-mount technology (SMT) yield even when the semiconductor die (the SOC die 302) is replaced. Additionally, the signal integrity/power integrity (SI/PI) performance of the embedded MIM capacitor structure 450a can be improved due to the shortened routing path between the semiconductor die (the SOC die 302) and the MIM capacitor structure 450a. The embedded MIM capacitor structure 450a can provide design flexibility for the system integration of the semiconductor package assembly 500a.

Figure 2A:
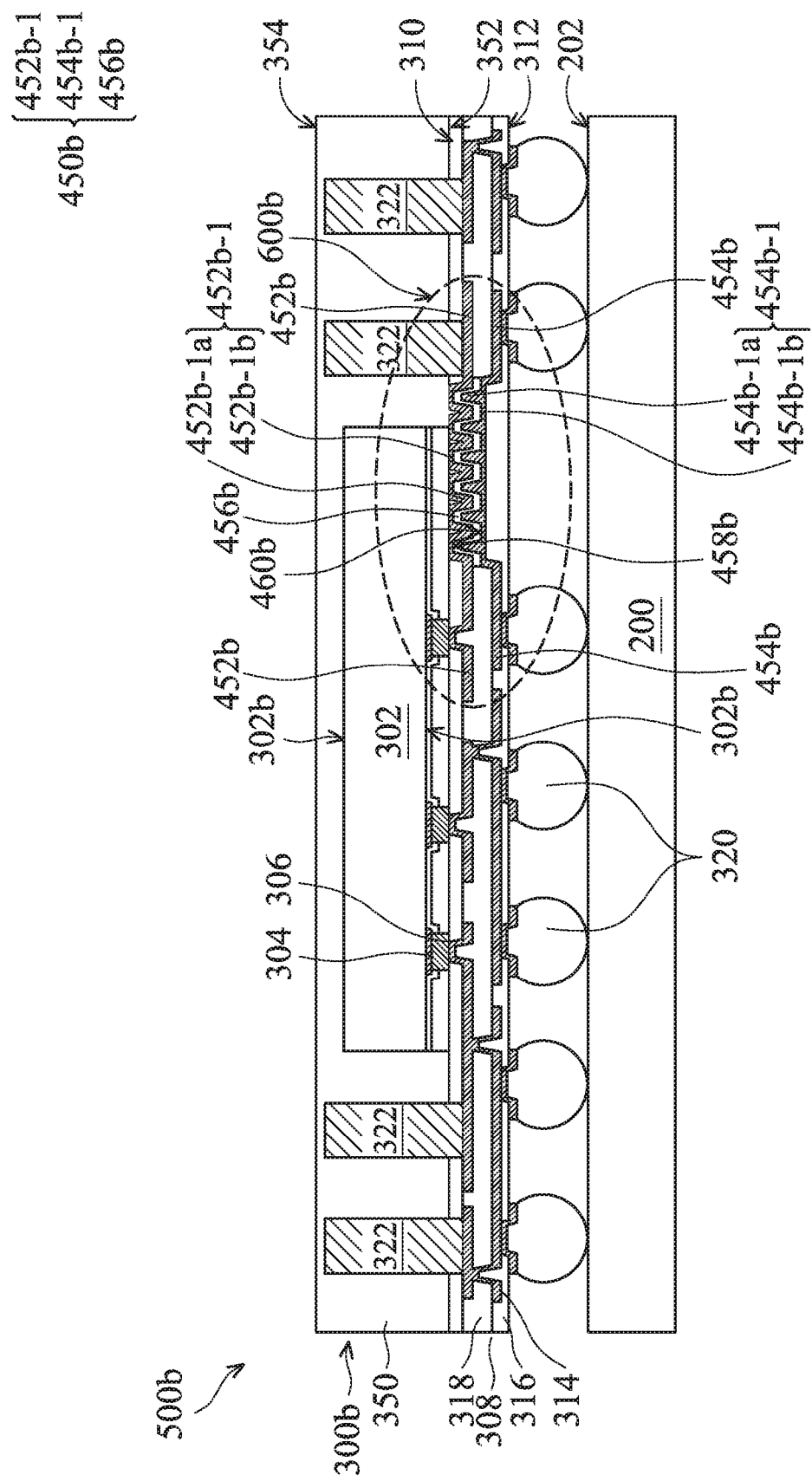
FIG. 2A is a cross-sectional view of a semiconductor package assembly including a system-on-chip (SOC) package in accordance with some other embodiments of the disclosure.
Figure 2B:
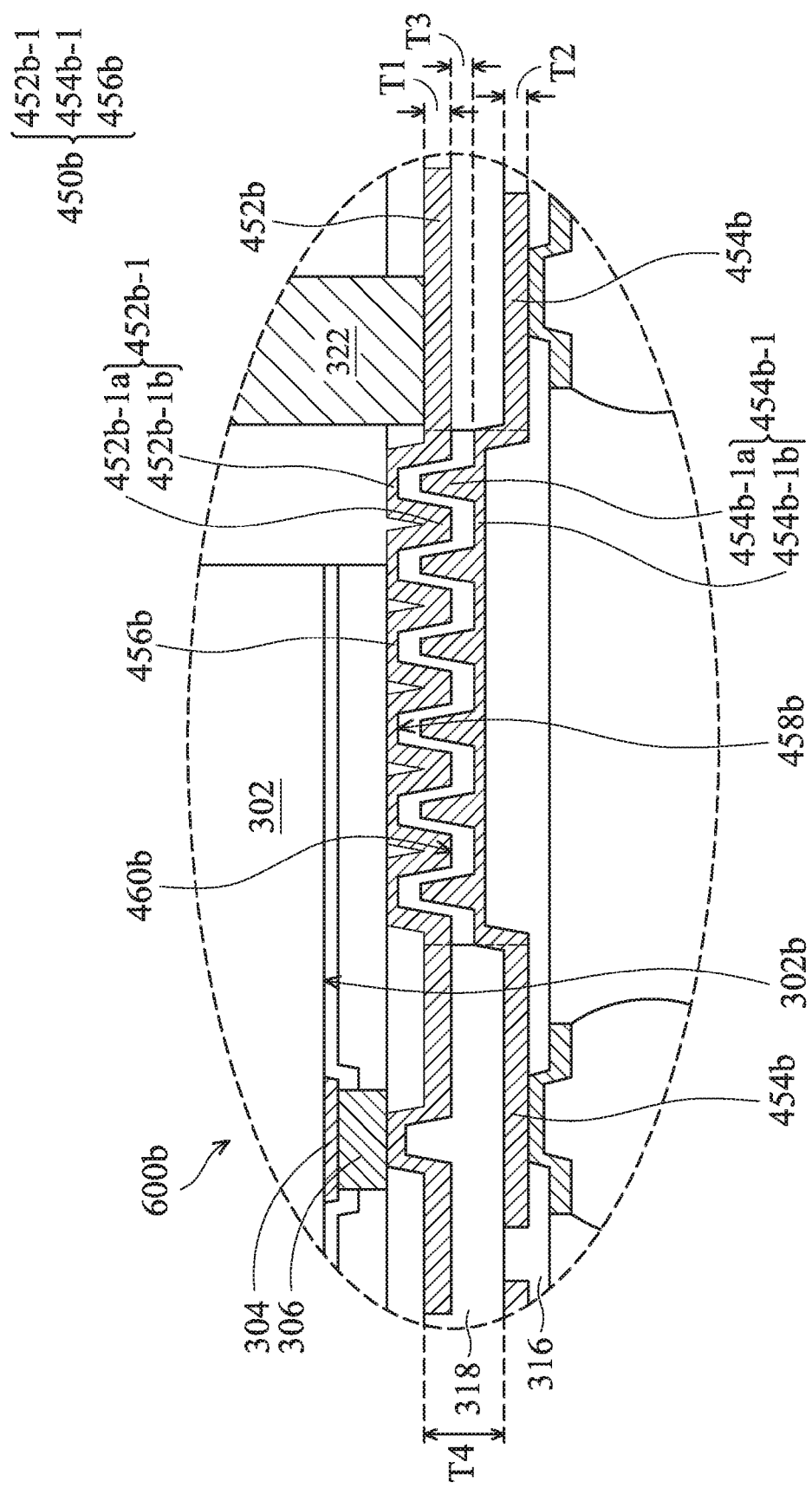
FIG. 2B is an enlarged view of a portion of FIG. 2A, showing a metal-insulator-metal (MIM) capacitor structure embedded in a redistribution layer (RDL) structure.

FIG. 2A is a cross-sectional view of a semiconductor package assembly 500b including a system-on-chip (SOC) package in accordance with some embodiments of the disclosure. FIG. 2B is an enlarged view of a portion 600b of FIG. 2A, showing a metal-insulator-metal (MIM) capacitor structure 450b embedded in a redistribution layer (RDL) structure 308. Descriptions of elements of the embodiments hereinafter that are the same or similar as those previously described with reference to FIGS. 1A and 1B are omitted for brevity.

As shown in FIGS. 2A and 2B, one of the differences between the semiconductor package assembly 500a shown in FIG. 1 and the semiconductor package assembly 500b is that the semiconductor package assembly 500b includes the MIM capacitor structure 450b embedded in the RDL structure 308 of a system-on-chip (SOC) package 300b. In some embodiments, the MIM capacitor structure 450b includes a first electrode 452b-1, a second electrode 454b-1 and an inter-metal dielectric (IMD) layer 456b therebetween. In some embodiments, the first electrode 452b-1 is a segment of a first conductive trace 452b of the RDL structure 308, which is close to the semiconductor die 302. Also, the second electrode 454b-1 is a segment of a second conductive trace 454b of the RDL structure 308, which is close to the conductive structures 320. As shown in FIGS. 2A and 2B, the first conductive trace 452b is designed to be positioned at a first layer-level, and the second conductive trace 454b is designed to be positioned at a second layer-level different from the first layer-level. Also, the first conductive trace 452b is separated from the second conductive trace 454b through the inter-metal dielectric (IMD) layers 318 and 456b. The first conductive trace 452b is designed to have a uniform thickness T1. Similarly, the second conductive trace 454b is designed to have a uniform thickness T2. In some embodiments, the thickness T1 is substantially equal to the thickness T2. For example, the thickness T1 and the thickness T2 are designed to be less than or equal to 4 μm.

In one embodiment, as shown in FIG. 2B, the first electrode 452b-1 is substantially parallel to the second electrode 454b-1. The first electrode 452b-1 and the second electrode 454b-1 of the MIM capacitor structure 450b are zigzag shapes in a cross-sectional view. For example, the first electrode 452b-1 has an uneven surface including convex portions 452b-1a and concave portions 452b-1b in the cross-sectional view as shown in FIG. 2B. Similarly, the second electrode 454b-1 has an uneven surface including convex portions 454b-1a and concave portions 454b-1b in the cross-sectional view as shown in FIG. 2B.

As shown in FIGS. 2A and 2B, the IMD layer 456b of the MIM capacitor structure 450b is disposed beside the IMD layer 318, which is between the first conductive trace 452b and the second conductive trace 454b. The IMD layer 456a is a zigzag shape in a cross-sectional view. Also, the first electrode 452b-1 and the second electrode 454b-1 of the MIM capacitor structure 450b, which are in contact with the IMD layer 456b, are zigzag shape in the cross-sectional view as shown in FIGS. 2A and 2B. In some embodiments, an interface 458b between the first electrode 452b-1 and the IMD layer 456a, or an interface 460b between the second electrode 454b-1 and the IMD layer 456b, is substantially an uneven and periodically varying surface in the cross-sectional view as shown in FIGS. 2A and 2B. For example, the interface 458b has an uneven surface including convex portions corresponding to the convex portions 452b-1a and concave portions corresponding to the concave portions 452b-1b. Similarly, the interface 460b has an uneven surface including convex portions corresponding to the convex portions 454b-1a and concave portions corresponding to the concave portions 454b-1b.

As shown in FIG. 2B, the thickness T3 of the IMD layer 456b of the MIM capacitor structure 450b is designed to be less than the thickness T4 of the IMD layer 318. Also, the thickness T3 of the IMD layer 456b is designed to be less than or equal to the thickness T1 of the first conductive trace 452b and the thickness T2 of the second conductive trace 454b in the cross-sectional view as shown in FIG. 2B. For example, the thickness T3 of the IMD layer 456b of the MIM capacitor structure 450b is designed to be less than or equal to about 4 μm.

In some embodiments, the semiconductor package assembly 500b is designed to fabricate a passive device structure, for example, a metal-insulator-metal (MIM) capacitor structure 450b embedded in a redistribution layer (RDL) structure 308 of the semiconductor package 300b. The advantages of the semiconductor package assembly 500b are similar to those of the semiconductor package assembly 500a. Also, the capacitor structure 450b is designed to have zigzag-shaped electrodes (the first electrode 452b-1 and the second electrode 454b-1) and a zigzag-shaped capacitor dielectric layer (the IMD layer 456b) to increase the area of the capacitor structure 450b, so that the larger capacitance value is obtained. Additionally, the capacitor structure 450b is designed to increase the dielectric constant (k) of the IMD layer 456b, or to decrease the thicknesses of the first electrode 452b-1 (the thickness T1), the second electrode 454b-1 (the thickness T2) and the IMD layer 456b (the thickness T3) to obtain the larger capacitance value.

Figure 3:
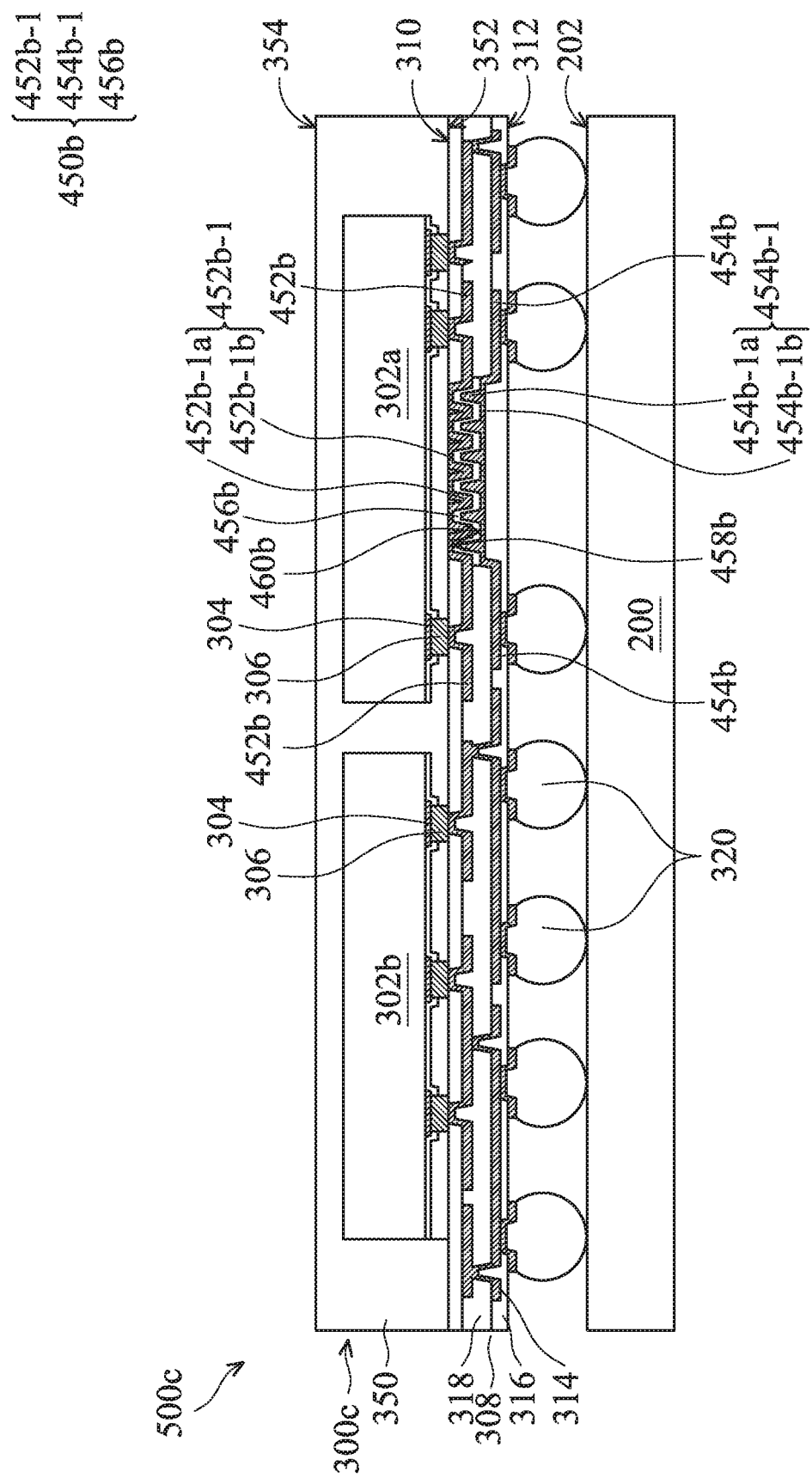
FIG. 3 is a cross-sectional view of a semiconductor package assembly including a system-on-chip (SOC) package in accordance with some other embodiments of the disclosure.

FIG. 3 is a cross-sectional view of a semiconductor package assembly 500c including a semiconductor package 300c in accordance with some embodiments of the disclosure. Descriptions of elements of the embodiments hereinafter that are the same or similar as those previously described with reference to FIGS. 1A-1B and 2A-2B are omitted for brevity.

As shown in FIG. 3, one of the differences between the semiconductor package assembly 500b shown in FIGS. 2A and 2B and the semiconductor package assembly 500c is that a semiconductor package 300c of the semiconductor package assembly 500c includes two semiconductor dies 202a and 202b arranged side-by-side. In some embodiments, at least one of the semiconductor dies 202a and 202b is a system on chip (SOC) die. For example, the semiconductor dies 202a and 202b are SOC die. Alternatively, the semiconductor die 202a is a SOC die, and the semiconductor dies 202b is a memory die, such as a dynamic random access memory (DRAM) die. In some embodiments, the MIM capacitor structure 450b embedded in the RDL structure 308 is designed to be coupled to the SOC die (semiconductor die 202a).

Therefore, the semiconductor package 300c of the semiconductor package assembly 500c includes a pure SOC package or a hybrid SOC package. However, the number and the arrangement of semiconductor dies are not limited to the disclosed embodiment.

Figure 4:
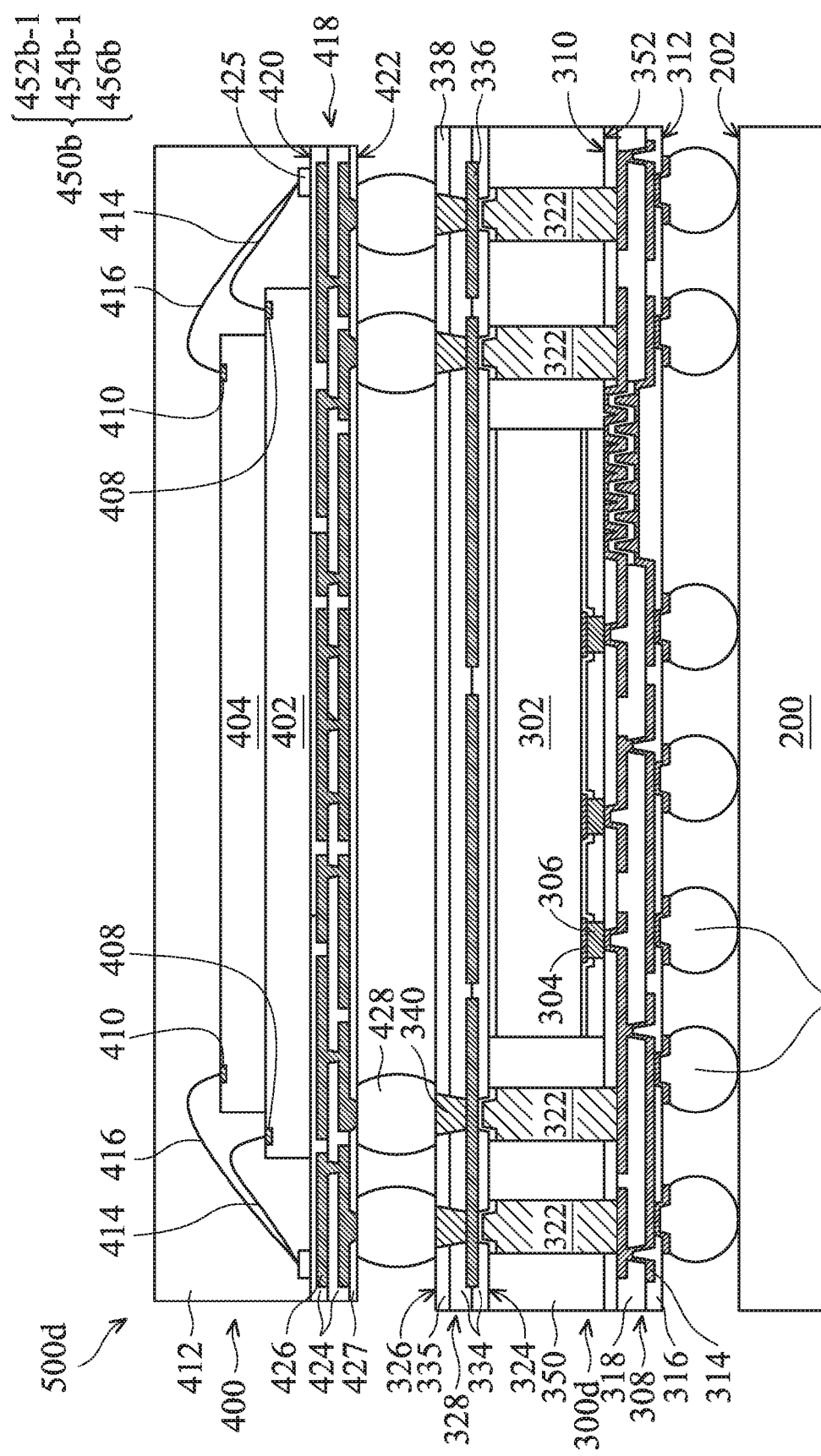
FIG. 4 is a cross-sectional view of a semiconductor package assembly including a system-on-chip (SOC) package and a dynamic random access memory (DRAM) package stacked thereon in accordance with some embodiments of the disclosure.

FIG. 4 is a cross-sectional view of a semiconductor package assembly 500d including a first semiconductor package 300d and a second semiconductor package 400, for example, a dynamic random access memory (DRAM) package, stacked thereon in accordance with some embodiments of the disclosure. Descriptions of elements of the embodiments hereinafter that are the same or similar as those previously described with reference to FIGS. 1A-1B, 2A-2B and 3A-3B are omitted for brevity.

As shown in FIG. 4, one of the differences between the semiconductor package assembly 500b shown in FIGS. 2A and 2B and the semiconductor package assembly 500d is that a first semiconductor package 300d of the semiconductor package assembly 500d further includes a second redistribution layer (RDL) structure 328 disposed on the first semiconductor die 302. Also, the semiconductor package assembly 500d further includes an second semiconductor package 400 stacked on the semiconductor package 300d by a bonding process. The RDL structure 328 is disposed on the molding compound 350. A surface 324 of the RDL structure 328, which is close to the first semiconductor die 302, is in contact with the surface 354 of the molding compound 350. In other words, the opposite surfaces 352 and 354 of the molding compound 350 are in contact with the RDL structures 308 and 328, respectively.

Like the RDL structure 308, the RDL structure 328 may have one or more conductive traces 336 disposed in one or more inter-metal dielectric (IMD) layers 334. Pad portions of the conductive traces 336 are exposed to openings of one the IMD layers 334, which is away from the surface 354 of the molding compound 350. However, it should be noted that the number of conductive traces 336 and the number of IMD layers 328 shown in FIG. 4 is only an example and is not a limitation to the present invention. As shown in FIG. 4, the RDL structure 328 is coupled to the RDL structure 308 by vias 322 passing through the molding compound 350 between the RDL structure 308 and the RDL structure 328.

As shown in FIG. 4, the semiconductor package assembly 500d further includes the second semiconductor package 400 stacked on the first semiconductor package 300d. In this embodiment, the second semiconductor package 400 includes a memory package, for example, a dynamic random access memory (DRAM) package. The second semiconductor package 400 is mounted on the first semiconductor package 300 through the conductive structures 428. The second semiconductor package 400 is coupled to the RDL structure 308 of the by the RDL structure 328 and the vias 322 of the first semiconductor package 300d.

As shown in FIG. 4, the second semiconductor package 400 comprises a redistribution layer (RDL) structure 418, at least one semiconductor die (e.g. two DRAM dies 402 and 404) and a molding compound 412. Because the second semiconductor package 400 is stacked on the first semiconductor package 300d, the RDL structure 328 is positioned between the RDL structure 308 and 418. The RDL structure 418 has opposite surface 420 and 422. The surface 420 is provided for semiconductor dies mounted thereon, and the surface 422 is provided for conductive bumps 428 attached thereon. Like the RDL structure 308 and 328, the RDL structure 418 may have one or more conductive traces 426 disposed in one or more inter-metal dielectric (IMD) layers 424. Pad portions of the conductive traces 426 are exposed to openings of a solder mask layer 427. However, it should be noted that the number of conductive traces 426 and the number of IMD layers 424 shown in FIG. 4 is only an example and is not a limitation of the present invention In this embodiment as shown in FIG. 4, the semiconductor dies 402 and 404 are DRAM dies. The semiconductor die 402 is mounted on the surface 420 of the RDL structure 418 with a paste (not shown). Also, the semiconductor die 404 is stacked on the semiconductor die 402 with a paste (not shown). The semiconductor die 402 has pads 408 thereon, and the semiconductor die 404 has pads 410 thereon.

The pads 408 and 410 of the semiconductor dies 402 and 404 may be coupled to pads 425 of the RDL structure 418 by bonding wires, for example bonding wires 414 and 416, respectively. However, the number of stacked semiconductor dies is not limited to the disclosed embodiment. Alternatively, the two semiconductor dies 402 and 404 shown in FIG. 4 can be arranged side by side. Therefore, the semiconductor dies 402 and 404 are mounted on the surface 420 of the RDL structure 418 by a paste (not shown).

As shown in FIG. 4, the molding compound 412 surrounds the semiconductor dies 402 and 404. Also, the molding compound 412 is in contact with the surface 420 of the RDL structure 412 and the semiconductor dies 402 and 404. Like molding compound 350, molding compound 412 may be formed of a nonconductive material, such as an epoxy, a resin, a moldable polymer, or the like.

As shown in FIG. 4, the second semiconductor package 400 further includes conductive structures 428 disposed on the surface 422 of the RDL structure 418, which is away from the semiconductor dies 402 and 404. The conductive structures 428 are formed through the openings of the solder mask layer 427 to couple to the conductive traces 424. Also, the conductive structures 428 are separated from the molding compound 412 through the RDL structure 418. The second semiconductor package 400 is coupled to the RDL structure 308 and/or the MIM capacitor structure 450b of the first semiconductor package 300d. More specifically, the conductive structures 428 of the second semiconductor package 400 are coupled to vias 340 formed through the RDL structure 328 of the first semiconductor package 300d. Also, the vias 340 are coupled to the conductive traces 336 of the RDL structure 328. Like conductive structures 320, conductive structures 428 may comprise a conductive bump structure such as a copper bump or a solder bump structure, a conductive pillar structure, a conductive wire structure, or a conductive paste structure.

The sorts of semiconductor dies are not limited to the disclosed embodiment. For example, in some embodiments, the semiconductor die 302 can be a baseband chip, another semiconductor 402 or 404 can be a RF (radio-frequency) chip. In other some embodiments, the semiconductor die 302 can be a AP (analog processor) chip, another semiconductor die 402 or 404 can be a DP (digital processor) chip.

Embodiments provide a semiconductor package assembly. In some embodiments, the semiconductor package assembly is designed to fabricate a passive device structure, for example, a metal-insulator-metal (MIM) capacitor structure embedded in and integrated with a redistribution layer (RDL) structure. The MIM capacitor structure is composed segments of conductive traces (serving as the first electrode and the second electrode) of the RDL structure and a high-k capacitor dielectric material layer (k≥20) beside the low-k IMD layer (k≈4) of the RDL structure. The capacitor structure is designed to increase the dielectric constant (k) of the high-k capacitor dielectric material layer, or to decrease the thicknesses of the first electrode, the second electrode and the high-k capacitor dielectric material layer, so that the larger capacitance value is obtained. Alternatively, the capacitor structure is designed to have zigzag-shaped electrodes and a zigzag-shaped capacitor dielectric layer to increase the area of the capacitor structure, thereby increasing the capacitance value. The fabrication process of embedded MIM capacitor structure can be integrated with that of the RDL structure. Therefore, the MIM capacitor structure may provide the comparable process capability. Therefore, the MIM capacitor structure may provide the comparable process capability. Also, the semiconductor package assembly may help to improve the surface-mount technology (SMT) yield even when the semiconductor die (the SOC die) is replaced. Additionally, the signal integrity/power integrity (SI/PI) performance of the embedded MIM capacitor structure can be improved due to the shortened routing path between the semiconductor die (the SOC die) and the MIM capacitor structure. The embedded MIM capacitor structure can provide the design flexibility for the system integration of the semiconductor package assembly.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
a first semiconductor package, comprising:
a first semiconductor die; and
a first redistribution layer (RDL) structure coupled to the first semiconductor die, wherein the first redistribution layer (RDL) structure comprises:
a first conductive trace at a first layer-level;
a second conductive trace at a second layer-level; and
a first inter-metal dielectric (IMD) layer and a second inter-metal dielectric (IMD) layer, which is beside the first inter-metal dielectric (IMD) layer, wherein the first inter-metal dielectric (IMD) layer and the second inter-metal dielectric (IMD) layer are disposed adjacent to each other with each extending between the first conductive trace and the second conductive trace, wherein the dielectric constant of the first inter-metal dielectric (IMD) layer is lower than the dielectric constant of the second inter-metal dielectric (IMD) layer.

2. The semiconductor package assembly as claimed in claim 1, wherein the first semiconductor package comprises:
a first molding compound surrounding the first semiconductor die; and
first conductive structures disposed on and coupled to the first RDL structure.

3. The semiconductor package assembly as claimed in claim 2, wherein the first conductive trace is disposed close to the first semiconductor die, wherein the second conductive trace is disposed close to the first conductive structures.

4. The semiconductor package assembly as claimed in claim 2, wherein the first semiconductor package comprises:
a second redistribution layer (RDL) structure disposed on the first semiconductor die, wherein the first molding compound has two opposite surfaces in contact with the first RDL structure and the second RDL structure, respectively; and first vias passing through the first molding compound between the first RDL structure and the second RDL structure, wherein the first vias surround the first semiconductor die.

5. The semiconductor package assembly as claimed in claim 1, wherein the first conductive trace is separated from the second conductive trace.

6. The semiconductor package assembly as claimed in claim 1, wherein the dielectric constant of the first inter-metal dielectric (IMD) layer is five times lower than the dielectric constant of the second inter-metal dielectric (IMD) layer.

7. The semiconductor package assembly as claimed in claim 6, wherein the dielectric constant of the second inter-metal dielectric (IMD) layer is larger than or equal to 20.

8. The semiconductor package assembly as claimed in claim 7, wherein of a first thickness of the first inter-metal dielectric (IMD) layer is greater than a second thickness of the second inter-metal dielectric (IMD) layer in a cross-sectional view.

9. The semiconductor package assembly as claimed in claim 8, wherein the second thickness is less than or equal to 4 μm.

10. The semiconductor package assembly as claimed in claim 7, wherein the second inter-metal dielectric (IMD) layer is zigzag shape in a cross-sectional view.

11. The semiconductor package assembly as claimed in claim 10, wherein a first portion of the first conductive trace and a second portion of the second conductive trace, which are in contact with the second inter-metal dielectric (IMD) layer, are zigzag shapes in the cross-sectional view.

12. The semiconductor package assembly as claimed in claim 1, wherein the first semiconductor package further comprises:
a second semiconductor die coupled to the first RDL structure, wherein the first semiconductor die and the second semiconductor die are arranged side-by-side.

13. The semiconductor package assembly as claimed in claim 12, further comprising:
a second semiconductor package stacked on the first semiconductor package, comprising:
a third redistribution layer (RDL) structure;
a second semiconductor die coupled to the third RDL structure; and
a second molding compound surrounding the second semiconductor die, being in contact with the third RDL structure and the second semiconductor die.

14. The semiconductor package assembly as claimed in claim 13, wherein the second RDL structure is disposed between the first RDL structure and the third RDL structure.

15. The semiconductor package assembly as claimed in claim 13, wherein the second semiconductor package comprises:
second conductive structures disposed on a surface of the third RDL structure, which is away from the second semiconductor die, wherein the second conductive structures are coupled to the third RDL structure.

16. The semiconductor package assembly as claimed in claim 13, wherein the first semiconductor package is a system-on-chip (SOC) package, and the second semiconductor package is a DRAM package.

17. The semiconductor package assembly as claimed in claim 12, wherein the second semiconductor package further comprises:
a third semiconductor die coupled to the third RDL structure, wherein the second semiconductor die and the third semiconductor die are arranged side-by-side.

18. A semiconductor package assembly, comprising:
a first semiconductor package, comprising:
a first semiconductor die; and
a first redistribution layer (RDL) structure coupled to the first semiconductor die, wherein the first redistribution layer (RDL) structure comprises:
a first conductive trace at a first layer-level;
a second conductive trace at a second layer-level;
a first inter-metal dielectric (IMD) layer and a second inter-metal dielectric (IMD) layer disposed adjacent to each other with each extending between the first conductive trace and the second conductive trace; and
a capacitor structure composed of the first conductive trace, the second conductive trace and the second inter-metal dielectric (IMD) layer, wherein the dielectric constant of the first inter-metal dielectric (IMD) layer is five times lower than the dielectric constant of the second inter-metal dielectric (IMD) layer.

19. The semiconductor package assembly as claimed in claim 18, wherein the second inter-metal dielectric (IMD) layer is beside the first inter-metal dielectric (IMD) layer, wherein the second inter-metal dielectric (IMD) layer is disposed between the first conductive trace and the second conductive trace.

20. The semiconductor package assembly as claimed in claim 18, wherein the first semiconductor package comprises:
a first molding compound surrounding the first semiconductor die;
first vias passing through the first molding compound, wherein the first vias surround the first semiconductor die; and
first conductive structures disposed on and coupled to the first RDL structure.

21. The semiconductor package assembly as claimed in claim 18, wherein the first conductive trace is separated from the second conductive trace.

22. The semiconductor package assembly as claimed in claim 18, wherein the dielectric constant of the second inter-metal dielectric (IMD) layer is larger than or equal to 20.

23. The semiconductor package assembly as claimed in claim 18, wherein of a first thickness of the first inter-metal dielectric (IMD) layer is greater than a second thickness of the second inter-metal dielectric (IMD) layer in a cross-sectional view.

24. The semiconductor package assembly as claimed in claim 18, wherein the second inter-metal dielectric (IMD) layer is a zigzag shape in a cross-sectional view.

25. The semiconductor package assembly as claimed in claim 24, wherein a first portion of the first conductive trace and a second portion of the second conductive trace, which are in contact with the second inter-metal dielectric (IMD) layer, are zigzag shapes in the cross-sectional view.

26. The semiconductor package assembly as claimed in claim 18, wherein the first semiconductor package comprises:
a second redistribution layer (RDL) structure disposed on the first semiconductor die, wherein the first molding compound has two opposite surfaces in contact with the first RDL structure and the second RDL structure, respectively.

27. The semiconductor package assembly as claimed in claim 26, further comprising:

a second semiconductor package stacked on the first semiconductor package, comprising:
a third redistribution layer (RDL) structure;
a second semiconductor die coupled to the third RDL structure;
a second molding compound surrounding the second semiconductor die, being in contact with the third RDL structure and the second semiconductor die; and
second conductive structures disposed on a surface of the third RDL structure, which is away from the second semiconductor die, wherein the second conductive structures are coupled to the third RDL structure.

28. The semiconductor package assembly as claimed in claim 27, wherein the second semiconductor package further comprises:
a third semiconductor die coupled to the third RDL structure, wherein the second semiconductor die and the third semiconductor die are arranged side-by-side.

29. The semiconductor package assembly as claimed in claim 18, wherein the first semiconductor package further comprises:
a second semiconductor die coupled to the first RDL structure, wherein the first semiconductor die and the second semiconductor die are arranged side-by-side.

30. A semiconductor package assembly, comprising:
a first semiconductor package, comprising:
a first semiconductor die; and
a first redistribution layer (RDL) structure coupled to the first semiconductor die, wherein the first redistribution layer (RDL) structure comprises:
a first conductive trace at a first layer-level;
a second conductive trace at a second layer-level;
a first inter-metal dielectric (IMD) layer and a second inter-metal dielectric (IMD) layer adjacent to each other with each extending between the first conductive trace and the second conductive trace, wherein the dielectric constant of the first inter-metal dielectric (IMD) layer is lower than the dielectric constant of the second inter-metal dielectric (IMD) layer; and
a capacitor structure composed of the first conductive trace, the second conductive trace and the second inter-metal dielectric (IMD) layer, wherein the thickness of the second inter-metal dielectric (IMD) layer is less than or equal to those of the first conductive trace and the second conductive trace.

31. The semiconductor package assembly as claimed in claim 30, wherein the second inter-metal dielectric (IMD) layer is beside the first inter-metal dielectric (IMD) layer, wherein the second inter-metal dielectric (IMD) layer is disposed between the first conductive trace and the second conductive trace.

32. The semiconductor package assembly as claimed in claim 30, wherein the first semiconductor package comprises:
a first molding compound surrounding the first semiconductor die;
first vias passing through the first molding compound, wherein the first vias surround the first semiconductor die; and
first conductive structures disposed on and coupled to the first RDL structure.

33. The semiconductor package assembly as claimed in claim 30, wherein the first conductive trace is separated from the second conductive trace.

34. The semiconductor package assembly as claimed in claim 30, wherein the dielectric constant of the first inter-metal dielectric (IMD) layer is five times lower than the dielectric constant of the second inter-metal dielectric (IMD) layer.

35. The semiconductor package assembly as claimed in claim 30, wherein of a first thickness of the first inter-metal dielectric (IMD) layer is greater than a second thickness of the second inter-metal dielectric (IMD) layer in a cross-sectional view.

36. The semiconductor package assembly as claimed in claim 30, wherein the second inter-metal dielectric (IMD) layer is a zigzag shape in a cross-sectional view.

37. The semiconductor package assembly as claimed in claim 36, wherein a first portion of the first conductive trace and a second portion of the second conductive trace, which are in contact with the second inter-metal dielectric (IMD) layer, are zigzag shapes in the cross-sectional view.

38. The semiconductor package assembly as claimed in claim 30, wherein the first semiconductor package comprises:
a second redistribution layer (RDL) structure disposed on the first semiconductor die, wherein the first molding compound has two opposite surfaces in contact with the first RDL structure and the second RDL structure, respectively.

39. The semiconductor package assembly as claimed in claim 38, further comprising:
a second semiconductor package stacked on the first semiconductor package, comprising:
a third redistribution layer (RDL) structure;
a second semiconductor die coupled to the third RDL structure;
a second molding compound surrounding the second semiconductor die, being in contact with the third RDL structure and the second semiconductor die; and
second conductive structures disposed on a surface of the third RDL structure, which is away from the second semiconductor die, wherein the second conductive structures are coupled to the third RDL structure.

40. The semiconductor package assembly as claimed in claim 39, wherein the second semiconductor package further comprises:
a third semiconductor die a third semiconductor die coupled to the third RDL, wherein the second semiconductor die and the third semiconductor die are arranged side-by-side.

41. The semiconductor package assembly as claimed in claim 30, wherein the first semiconductor package further comprises:
a second semiconductor die coupled to the first RDL structure, wherein the first semiconductor die and the second semiconductor die are arranged side-by-side.

* * * * *